United States Patent
Lee et al.

(10) Patent No.: US 12,477,928 B2
(45) Date of Patent: Nov. 18, 2025

(54) DISPLAY MODULE

(71) Applicant: SAMSUNG DISPLAY CO., LTD., Yongin-si (KR)

(72) Inventors: Wonchul Lee, Yongin-si (KR); Kijong Kim, Yongin-si (KR); Minki Kim, Yongin-si (KR); Minsuk Chung, Yongin-si (KR); Jaehyun Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 411 days.

(21) Appl. No.: 18/131,488

(22) Filed: Apr. 6, 2023

(65) Prior Publication Data
US 2023/0371341 A1 Nov. 16, 2023

(30) Foreign Application Priority Data

May 16, 2022 (KR) .................. 10-2022-0059849
Jun. 8, 2022 (KR) .................. 10-2022-0069575

(51) Int. Cl.
*G02F 1/1333* (2006.01)
*H10K 59/12* (2023.01)
*H10K 59/65* (2023.01)

(52) U.S. Cl.
CPC ............. *H10K 59/65* (2023.02); *H10K 59/12* (2023.02)

(58) Field of Classification Search
CPC .. H10K 59/65; H10K 59/12; G02F 1/133509; G02F 1/13332
USPC ........................................................ 313/512
See application file for complete search history.

(56) References Cited

U.S. PATENT DOCUMENTS

| | | |
|---|---|---|
| 9,780,318 B2 | 10/2017 | Johnson et al. |
| 10,005,264 B2 | 6/2018 | Leatherdale et al. |
| 10,862,069 B2 | 12/2020 | Choi et al. |
| 2019/0196093 A1* | 6/2019 | Jung .................. G02F 1/13452 |
| 2021/0126066 A1* | 4/2021 | Hwang ............... H10K 50/868 |
| 2023/0165108 A1* | 5/2023 | Xu ...................... H10K 59/873 |
| | | 257/40 |

FOREIGN PATENT DOCUMENTS

| | | |
|---|---|---|
| KR | 101801689 B1 | 11/2017 |
| KR | 101818469 B1 | 1/2018 |
| KR | 1020180085028 A | 7/2018 |
| KR | 1020180085045 A | 7/2018 |
| KR | 1020200081218 A | 7/2020 |
| KR | 200492944 | 1/2021 |

\* cited by examiner

*Primary Examiner* — Christopher M Raabe
(74) *Attorney, Agent, or Firm* — CANTOR COLBURN LLP

(57) ABSTRACT

A display module includes: a display panel including a substrate, a transistor layer disposed on the substrate and including transistors, and a display layer disposed on the transistor layer and including a display element, where the display panel defines a groove or a through-hole therein; a base film including a first portion disposed on the display panel so that a portion of the first portion overlaps the groove or the through-hole, and a second portion connected to the first portion, wherein the base film defines a first indentation portion between the first portion and the second portion; and an adhesive layer bonding the first portion to the display panel.

20 Claims, 10 Drawing Sheets

DISPLAY MODULE

This application claims priority to Korean Patent Application Nos. 10-2022-0059849, filed on May 16, 2022, and 10-2022-0069575, filed on Jun. 8, 2022, and all the benefits accruing therefrom under 35 U.S.C. § 119, the contents of which in their entirety are herein incorporated by reference.

BACKGROUND

1. Field

One or more embodiments relate to a display module, and more particularly, to a display module in which the probability of occurrence of damage in a manufacturing process or the like is reduced.

2. Description of the Related Art

In general, a display device may include components, such as a display module and a battery electrically connected thereto. The display module includes display elements in a display area and is used to display images. Various additional functions have been added to the display module.

SUMMARY

However, in an existing display module, defects may occur in a manufacturing process in relation to added functions.

One or more embodiments include a display module in which the probability of occurrence of damage in a manufacturing process or the like is reduced. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display module includes: a display panel including a substrate, a transistor layer disposed on the substrate and including transistors, and a display layer disposed on the transistor layer and including a display element, where the display panel defines a groove or a through-hole therein; a base film including a first portion disposed on the display panel so that a portion of the first portion overlaps the groove or the through-hole, and a second portion connected to the first portion, where the base film defines a first indentation portion between the first portion and the second portion; and an adhesive layer bonding the first portion to the display panel.

The display module may further include a sensor inserted into the groove or the through-hole.

The base film may further define second indentation portion between the first portion and the second portion, and the second indentation portion may face the first indentation portion.

With respect to an imaginary line extending from a center of the first portion to a center of the second portion, the first indentation portion may be located on one side of the imaginary line and the second indentation portion may be located on the other side of the imaginary line.

A first edge of the first indentation portion in a direction to the first portion and a $1^{st}$-$1^{st}$ edge of the first portion connected to the first edge may form a first preset angle.

The first preset angle may be a right angle.

When viewed from a direction perpendicular to the base film, the adhesive layer may have a chamfered shape at a corner formed by the $1^{st}$-$1^{st}$ edge and the first edge.

When viewed from the direction perpendicular to the base film, the adhesive layer may have round shape at a corner formed by the $1^{st}$-$1^{st}$ edge and the first edge.

A second edge of the second indentation portion in the direction to the first portion and a $1^{st}$-$2^{nd}$ edge of the first portion connected to the second edge may form a second preset angle.

The second preset angle may be equal to the first preset angle.

Each of the first preset angle and the second preset angle may be a right angle.

When viewed from the direction perpendicular to the base film, the adhesive layer may have a chamfered shape at each of a corner formed by the $1^{st}$-$1^{st}$ edge and the first edge and a corner formed by the $1^{st}$-$2^{nd}$ edge and the second edge.

When viewed from the direction perpendicular to the base film, the adhesive layer may have a round shape at each of a corner formed by the $1^{st}$-$1^{st}$ edge and the first edge and a corner formed by the $1^{st}$-$2^{nd}$ edge and the second edge.

A third edge of the first indentation portion in a direction to the second portion and a $2nd$-$1^{st}$ edge of the second portion connected to the third edge may form a third preset angle that is different from the first preset angle.

The first preset angle may be a right angle and the third preset angle may be an obtuse angle.

A third edge of the first indentation portion in a direction to the second portion and a $2^{nd}$-$1^{st}$ edge of the second portion connected to the third edge may form a third preset angle that is different from the first preset angle, and a fourth edge of the second indentation portion in a direction to the second portion and a $2^{nd}$-$2^{nd}$ edge of the second portion connected to the fourth edge may form the third preset angle.

The adhesive layer may define an opening therein corresponding to the groove or the through-hole.

The adhesive layer may encircle the groove or the through-hole when viewed from the direction perpendicular to the base film.

The base film may further define an additional indentation portion located in the first portion.

The first portion may be integral with the second portion.

Other aspects, features, and advantages of the disclosure will become better understood through the detailed description, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
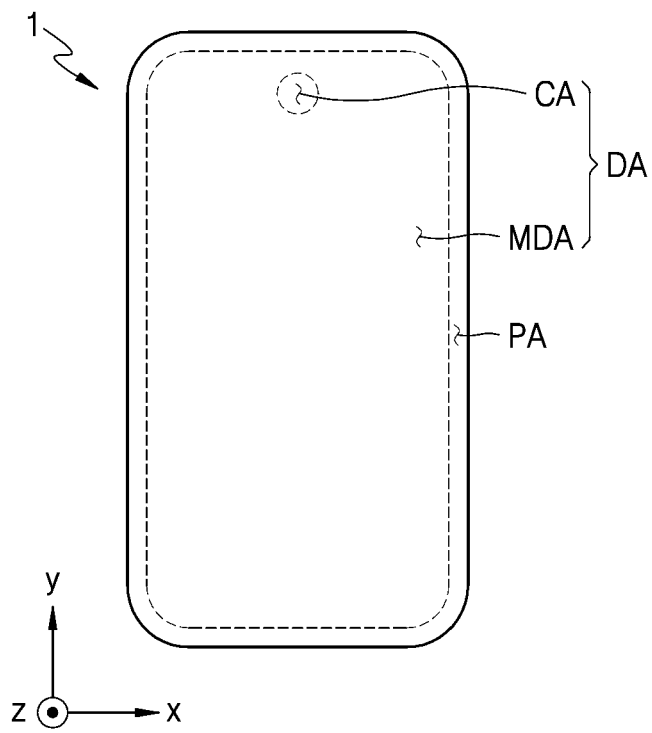
FIG. 1 is a plan view schematically illustrating a display module according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. Hereinafter, embodiments will be described in detail with reference to the accompanying drawings. When describing embodiments with reference to the accompanying drawings, the same or corresponding elements are denoted by the same reference numerals.

It will be understood that, when a layer, film, region, or plate is referred to as being "on" another element, the layer, film, region, or plate may be "directly on" the other element, and intervening elements may be present therebetween. Also, sizes of elements in the drawings may be exaggerated or reduced for convenience of explanation. For example, because sizes and thicknesses of elements in the drawings are arbitrarily illustrated for convenience of explanation, the disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a plan view schematically illustrating a display module according to an embodiment. The display module 1 according to the present embodiment may be a portion of a display device. The display device may be, for example, electronic devices, such as smartphones, mobile phones, navigation modules, game consoles, televisions ("TVs"), vehicle head units, notebook computers, laptop computers, tablet computers, personal media players ("PMPs"), or personal digital assistants ("PDAs"). Also, the electronic devices may be flexible devices.

The display module 1 includes a display area DA and a peripheral area PA outside the display area DA. In a plan view, the display area DA may approximately have a rectangular shape, as illustrated in FIG. 1. Of course, the disclosure is not limited thereto. The display area DA may have a polygonal shape, such as a triangular shape, a pentagonal shape, or a hexagonal shape, a circular shape, an oval shape, or an irregular shape in another embodiment. A corner of an edge of the display area DA may have a round shape. The peripheral area PA may be a type of a non-display area in which display elements are not arranged. The display area DA may be completely surrounded by the peripheral area PA.

Pixels including various display elements, such as organic light-emitting diodes ("OLEDs"), may be arranged in the display area DA. The pixels may be arranged in various forms, such as a stripe arrangement, a PenTile arrangement, or a mosaic arrangement, in the x-axis direction and the y-axis direction and may display an image.

The display area DA may include a main display area MDA and a component area CA. The main display area MDA may have a shape surrounding the component area CA. However, the disclosure is not limited thereto, and various modifications are possible. For example, a portion of the component area CA may be in contact with the peripheral area PA. That is, the main display area MDA may at least partially surround the component area CA. Of course, unlike in FIG. 1, the component area CA may be located in the peripheral area PA rather than in the display area DA.

As will be described below with reference to FIG. 3, a component 40 (see FIG. 3), which is an electronic element, may be disposed under a display panel 10 (see FIG. 3) to correspond to the component area CA. Light and/or sound output from the component 40 to the outside or traveling from the outside toward the component 40 may pass through the component area CA. Accordingly, the display panel 10 may have a through-hole 100P corresponding to the component area CA.

The component 40 may be an electronic element using light or sound. Examples of the electronic element may include a proximity sensor that measures distance, a sensor that recognizes a part of a user's body (e.g., a fingerprint, a face, an iris, a face, etc.), a small lamp that outputs light, an illumination sensor that measures brightness, or an image sensor (e.g., a camera) that captures an image. The electronic element using light may use light of various wavelength bands, such as visible light, infrared light, or ultraviolet light. The electronic element using sound may use ultrasonic waves or sound of other frequency bands. In some embodiments, the component 40 may include sub-components, such as a light-emitting part and a light-receiving part. The component 40 may include a light-emitting part and a light-receiving part, which are integrally formed as a single body, or may include a pair of a light-emitting part and a light-receiving unit, which are physically separated from each other.

When viewed from a direction (z-axis direction) substantially perpendicular to the upper surface of the display module 1 (i.e., in a plan view), the component area CA may have a polygonal shape, such as a triangular shape, a rectangular shape, a pentagonal shape, or a hexagonal shape, a circular shape, an oval shape, a star shape, or an irregular shape.

Figure 2:
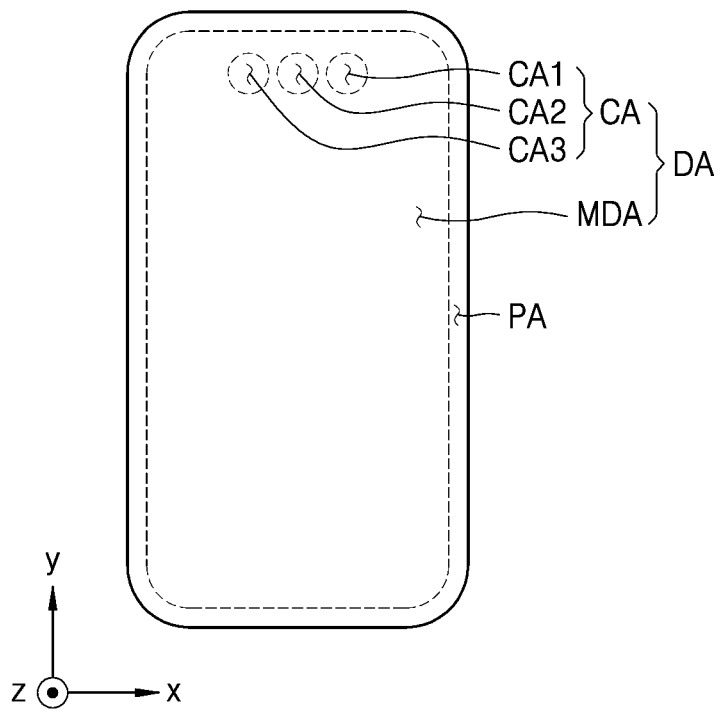
FIG. 2 is a plan view schematically illustrating a display module according to another embodiment.

FIG. 1 illustrates that the display area DA includes one component area CA. However, the disclosure is not limited thereto. For example, as illustrated in FIG. 2, which is a plan view schematically illustrating a display module according to another embodiment, the component area CA may include a plurality of sub-component areas, including first to third sub-component areas CA1, CA2, and CA3, which are spaced apart from each other. The sizes of the first to third sub-component areas CA1, CA2, and CA3 may be different from each other as necessary.

When the component area CA includes the first to third sub-component areas CA1, CA2, and CA3, components 40 having different functions from each other may be respectively arranged in the first to third sub-component areas CA1, CA2, and CA3. For example, a camera may be disposed under a display panel 10 to correspond to the first sub-component area CA1, an illumination sensor may be disposed under the display panel 10 to correspond to the second sub-component area CA2, and a proximity sensor may be disposed under the display panel to correspond to the third sub-component area CA3.

Figure 3:
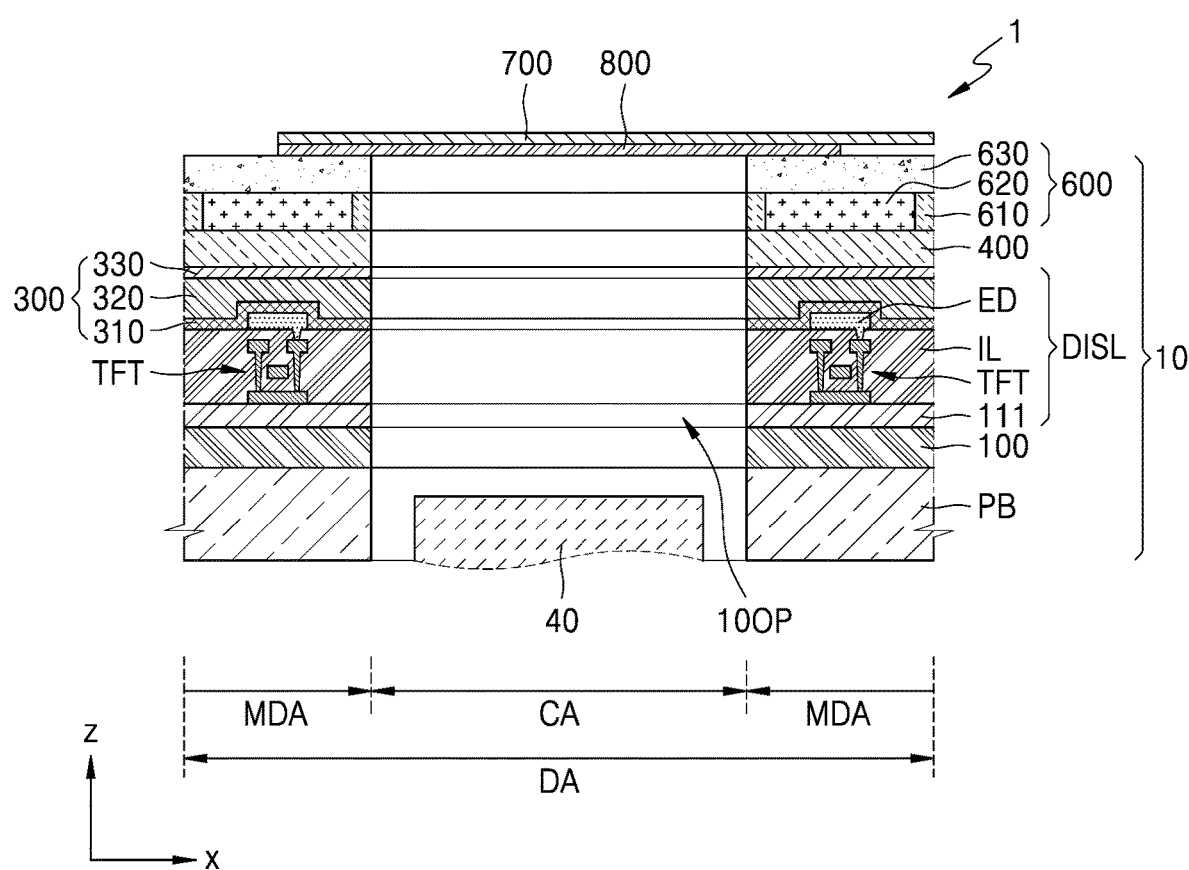
FIG. 3 is a cross-sectional view schematically illustrating a portion of the display module of FIG. 1.

FIG. 3 is a cross-sectional view schematically illustrating a portion of the display module 1 of FIG. 1.

As illustrated in FIG. 3, the display module 1 may include a display panel 10 and a component 40 overlapping the display panel 10. The display module 1 may include a base film 700 disposed on the display panel 10 and bonded to the display panel 10 through an adhesive layer 800.

A display area DA of the display panel 10 may include a component area CA and a main display area MDA. An image may be displayed in the main display area MDA. The component 40 may be disposed under the display panel 10 to correspond to the component area CA. That is, when viewed from a direction (z-axis direction) substantially perpendicular to the display module 1 (i.e., in a plan view), the component area CA may overlap the component 40.

The display panel 10 may include a substrate 100, a display element layer DISL, a touch screen layer 400, an anti-reflection layer 600, and a panel protection member PB disposed under the substrate 100.

The substrate 100 may include glass, metal, or polymer resin. When the display panel 10 is flexible or bendable, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. Of course, various modifications are possible. For example, the substrate 100 may have a multilayer structure including two layers including polymer resin and a barrier layer including an inorganic material (silicon oxide, silicon nitride, silicon oxynitride, etc.) between the two layers.

The display element layer DISL on the substrate 100 may include a transistor layer including thin-film transistors TFT, and a display layer disposed on the transistor layer and including a display element, such as a light-emitting element ED and a thin-film encapsulation layer 300 covering the display element. FIG. 3 illustrates that the display element layer DISL includes a buffer layer 111, and the thin-film transistor TFT or the like is disposed on the buffer layer 111. The light-emitting element ED may be an OLED. The thin-film transistor TFT included in the transistor layer may form a pixel circuit, and the pixel circuit may control emission or non-emission of the display element or the degree of light emission.

The display element, such as the light-emitting element ED, may be covered with the thin-film encapsulation layer 300, as illustrated in FIG. 3. The thin-film encapsulation layer 300 may include at least one inorganic encapsulation layer and at least one organic encapsulation layer, as illustrated in FIG. 3. For example, the thin-film encapsulation layer 300 may include a first inorganic encapsulation layer 310, a second inorganic encapsulation layer 330, and an organic encapsulation layer 320 therebetween.

The first inorganic encapsulation layer 310 and the second inorganic encapsulation layer 330 may include at least one inorganic insulating material selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$: ZnO or $ZnO_2$), and may be formed by chemical vapor deposition ("CVD"). The organic encapsulation layer 320 may include a polymer-based material. The polymer-based material may include silicone-based resin, acrylic resin (e.g., polymethyl methacrylate, polyacrylic acid, etc.), epoxy-based resin, polyimide, or polyethylene.

The first inorganic encapsulation layer 310, the organic encapsulation layer 320, and the second inorganic encapsulation layer 330 may be integrally formed (i.e., monolithic) as a single body to cover the main display area MDA and the component area CA.

The touch screen layer 400 may be configured to obtain coordinate information according to an external input, for example, a touch event. The touch screen layer 400 may include touch electrodes and touch lines connected to the touch electrodes. The touch screen layer 400 may sense an external input by using a self-capacitance method or a mutual capacitance method.

The touch screen layer 400 may be disposed on the thin-film encapsulation layer 300. Alternatively, the touch screen layer 400 may be separately formed on a touch substrate and then disposed on the thin-film encapsulation layer 300 through an adhesive layer, such as an optical clear adhesive ("OCA"). In an embodiment, the touch screen layer 400 may be formed directly on the thin-film encapsulation layer 300. In this case, the adhesive layer may not be between the touch screen layer 400 and the thin-film encapsulation layer 300.

The anti-reflection layer 600 may reduce the degree of reflection of light (external light) incident from the outside toward the display module 1. The anti-reflection layer 600 may include a light blocking layer 610, color filters 620, and an overcoat layer 630. The light blocking layer 610 may define an opening therein overlapping the light-emitting element ED arranged in the main display area MDA. The color filters 620 may be arranged in the opening.

The color filters 620 may be arranged considering the color of light emitted from each pixel of the display panel 10. For example, the color filters 620 may transmit red light, green light, or blue light according to the color of light emitted from the light-emitting element ED. The overcoat layer 630 may include an organic material, such as resin, and may be transparent.

In the case of the display panel 10 including the anti-reflection layer 600 including the color filters 620 and the light blocking layer 610, the thickness of the display panel 10 may be significantly reduced in order to reduce the reflectance of external light, compared to a display panel including a polarizing plate.

The panel protection member PB may be bonded to the lower portion of the substrate 100 to support and protect the substrate 100. The panel protection member PB may have an opening corresponding to the component area CA. Because the panel protection member PB has the opening, light and/or sound output from the component 40 overlapping the component area CA to the outside or light and/or sound traveling from the outside toward the component 40 may pass through the panel protection member PB. The panel protection member PB may include polyethylene terephthalate or polyimide.

The area of the component area CA may be greater than the area in which the component 40 is arranged. Accordingly, the area of the opening of the panel protection member PB may not coincide with the area of the component area CA. Even though FIG. 3 illustrates that at least a portion of the component 40 is inserted into the opening of the panel protection member PB, the component 40 may be spaced apart from the display panel 10.

In another embodiment, unlike in FIG. 3, the display panel 10 may further include a bottom metal layer ("BML"). The BML may be between the substrate 100 and the buffer layer 111. The BML may be disposed to overlap pixel circuits in order to protect the pixel circuits. For example, the BML may be disposed under the thin-film transistor TFT.

The BML may prevent or minimize a phenomenon in which light reaches the pixel circuits and affects the pixel circuits. The BML may have an opening corresponding to the component area CA.

Figure 4:
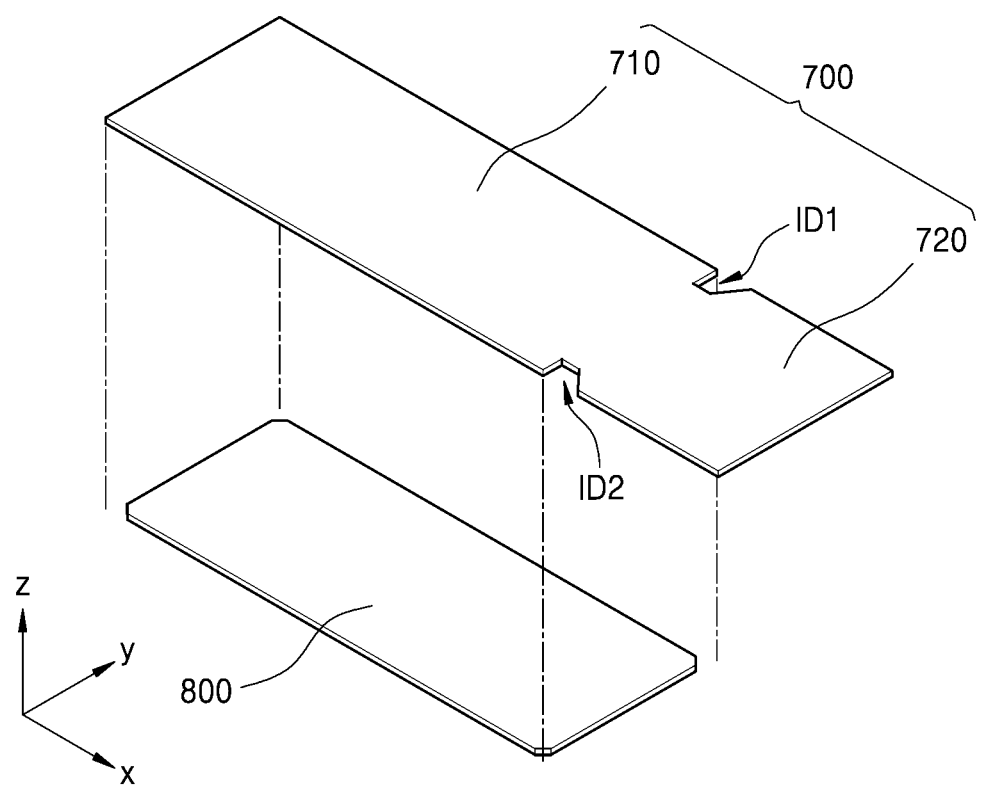
FIG. 4 is an exploded perspective view schematically illustrating a base film and an adhesive layer, which are included in a display module, according to an embodiment.
Figure 5:
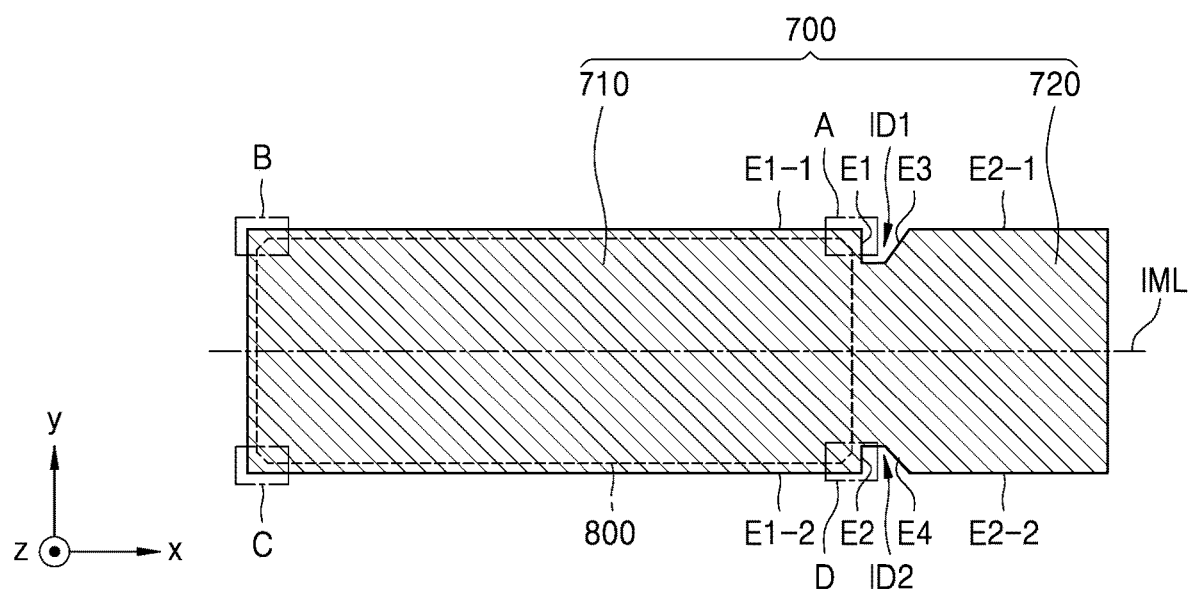
FIG. 5 is a plan view schematically illustrating the base film and the adhesive layer of FIG. 4.

FIG. 4 is an exploded perspective view schematically illustrating the base film 700 and the adhesive layer 800, which are included in the display module 1 of FIG. 3, and FIG. 5 is a plan view schematically illustrating the base film 700 and the adhesive layer 800 of FIG. 4.

The base film 700 may include a first portion 710 and a second portion 720, as illustrated in FIG. 4. The first portion 710 of the base film 700 is disposed on the display panel 10 so that a portion of the first portion 710 overlaps the through-hole 100P of the display panel 10 in a plan view, as illustrated in FIG. 3. The second portion 720 may be connected to the first portion 710 and may be integral with the first portion 710. The base film 700 defines a first indentation portion ID1 between the first portion 710 and the second portion 720. The adhesive layer 800 bonds the first portion 710 to the display panel 10. Accordingly, the adhesive layer 800 may overlap the first portion 710 and may not overlap the second portion 720 in a plan view.

The base film 700 may include polyethylene terephthalate or polyimide. The adhesive layer 800 may include, for example, a pressure sensitive adhesive ("PSA").

As described above, the display panel 10 included in the display module 1 may define the through-hole 100P corresponding to the component area CA therein, so that light and/or sound output from the component 40 to the outside or light and/or sound traveling from the outside toward the component 40 passes therethrough. In order to prevent infiltration of impurities, such as dust, into the through-hole 100P of the display module 1 during a manufacturing process, it is desirable to bond the base film 700 to the display panel 10 by using the adhesive layer 800 so that the base film 700 shields the through-hole 100P of the display panel 10, as illustrated in FIG. 3.

When the base film 700, on one surface of which the adhesive layer 800 is disposed, is bonded to the display panel 10, the relative position of the base film 700 with respect to the display panel 10 is aligned by using an optical camera in a state of holding the base film 700 by vacuum adsorption, etc., and the base film 700 is bonded to the display panel 10. When the relative position of the base film 700 with respect to the display panel 10 is not properly aligned, the base film 700 does not accurately shield the through-hole 100P of the display panel 10. Therefore, the relative position alignment of the base film 700 with respect to the display panel 10 is very important.

When the relative position of the base film 700 with respect to the display panel 10 is aligned by using the optical camera, the optical camera determines the position of the base film 700 by recognizing the edge corners and the first indentation portion ID1 of the base film 700. That is, the optical camera determines the position of the base film 700 by recognizing edge corners B and C of the base film 700 and a corner A formed by the first indentation portion ID1. Of course, as illustrated in FIGS. 4 and 5, when the base film 700 further define a second indentation portion ID2 between the first portion 710 and the second portion 720 to face the first indentation portion ID1, the optical camera may determine the position of the base film 700 by recognizing the edge corners B and C of the base film 700, the corner A formed by the first indentation portion ID1, and a corner D formed by the second indentation portion ID2.

Figure 6:
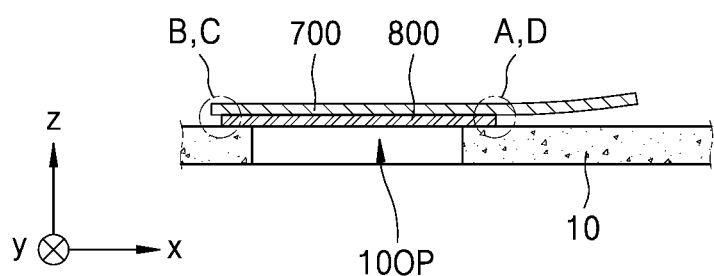
FIG. 6 is a cross-sectional view schematically illustrating a portion of a display module, according to an embodiment.

FIG. 6 illustrates that the optical camera recognizes the edge corners B and C of the base film 700, the corner A formed by the first indentation portion ID1, and the corner D formed by the second indentation portion ID2, determines the position of the base film 700 with respect to the through-hole 100P of the display panel 10 so as to align the relative position of the base film 700 with respect to the display panel 10, and then, the base film 700 is bonded to the display panel 10 by using the adhesive layer 800.

The optical camera recognizes not only the outermost corners including the edge corners B and C of the base film 700, but also the corner A formed by the first indentation portion ID1 and the corner D formed by the second indentation portion ID2. The edge corners B and C of the base film 700, the corner A formed by the first indentation portion ID1, and the corner D formed by the second indentation portion ID2 are located adjacent to corresponding corners of the adhesive layer 800, respectively. Accordingly, the positions of the adhesive layer 800 and the through-hole 100P of the display panel 10 may be accurately aligned.

Of course, the optical camera may recognize the corners of the adhesive layer 800. However, because the adhesive layer 800 is very thick and light transmittance of the adhesive layer 800 is great, it may be difficult for the optical camera to accurately recognize the corners of the adhesive layer 800. In the display module 1 according to the present embodiment, the optical camera recognizes the edge corners B and C of the base film 700, the corner A formed by the first indentation portion ID1, and the corner D formed by the second indentation portion ID2, and this is used to align the relative position of the display panel 10 with respect to the base film 700 in which the adhesive layer 800 is bonded to one surface thereof. Therefore, the base film 700 may be bonded at an accurate position on the display panel 10 by the adhesive layer 800.

Figure 7:
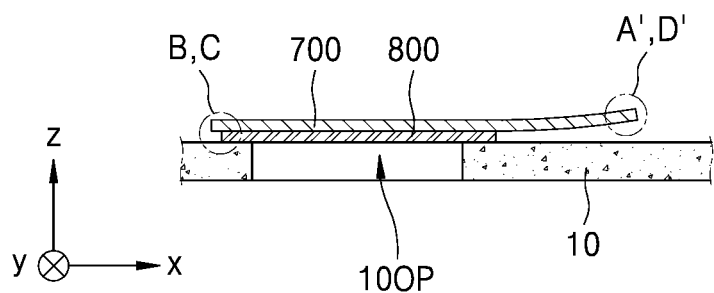
FIG. 7 is a cross-sectional view schematically illustrating a portion of a display module, according to a comparative example.

When the base film 700 does not have the first indentation portion ID1 and/or the second indentation portion ID2, the optical camera recognizes only edge corners A', B, C, and D' of the base film 700, as illustrated in FIG. 7, which is a cross-sectional view schematically illustrating a portion of a display module, according to a comparative example. In this case, the edge corners B and C of the base film 700 are located adjacent to corresponding corners of the adhesive layer 800, but the corners A' and D' of the base film 700 are located at a considerable distance from corresponding corners of the adhesive layer 800. In particular, because the second portion 720 of the base film 700 does not overlap the adhesive layer 800, it is highly likely that the shape of the second portion 720 of the base film 700 is deformed. For example, the second portion 720 has a more curved shape than the first portion 710, or the end of the second portion 720 is located farther away from the display panel 10 than a portion of the second portion 720 adjacent to the first portion 710. Therefore, when the optical camera recognizes only the edge corners A', B, C, and D' of the base film 700 in such a state and this is used to determine the relative positions between the base film 700 and the display panel 10, a positional relationship between the base film 700 and the display panel 10 may be different from a preset positional relationship. Accordingly, when the base film 700 is bonded to the display panel 10 by using the adhesive layer 800, the base film 700 may not accurately shield the through-hole 100P of the display panel 10, unlike in FIG. 7.

On the contrary, in the display module 1 according to the present embodiment, the base film 700 define the first indentation portion ID1 between the first portion 710 and the second portion 720, and may define the second indentation portion ID2 between the first portion 710 and the second portion 720 to face the first indentation portion ID1. Accordingly, the optical camera recognizes the edge corners B and C of the base film 700, the corner A formed by the first indentation portion ID1, and the corner D formed by the second indentation portion ID2, and this is used to align the relative positions between the display panel 10 and the base film 700 in which the adhesive layer 800 is bonded to one surface thereof. Therefore, the base film 700 may be bonded at an accurate position on the display panel 10 by the adhesive layer 800.

For reference, with respect to an imaginary line IML extending from the center of the first portion 710 to the center of the second portion 720 in the base film 700 in the x direction, the first indentation portion ID1 may be located on one side (+y direction) of the imaginary line IML and the second indentation portion ID2 may be located on the other side (−y direction) of the imaginary line IML. The second portion 720 of the base film 700 may be used as a handle or the like when the base film 700 is later removed from the display panel 10. This is because the second portion 720 of the base film 700 does not overlap the adhesive layer 800, and thus, is not bonded to the display panel 10.

A first edge E1, in a direction (−x direction) to the first portion 710, of the first indentation portion ID1 between the first portion 710 and the second portion 720 of the base film 700 and a $1^{st}$-$1^{st}$ edge E1-1 of the first portion 710 connected to the first edge E1 may form a first preset angle. This first preset angle may be a right angle, as illustrated in FIG. 5, that is, the first edge E1 may be perpendicular to the $1^{st}$-$1^{st}$ edge E1-1. Similarly, in the second indentation portion ID2 between the first portion 710 and the second portion 720 to face the first indentation portion ID1 in y direction, a second edge E2 in a direction (−x direction) to the first portion 710 and a $1^{st}$-$2^{nd}$ edge E1-2 of the first portion 710 connected to the second edge E2 may form a second preset angle. The second preset angle may be the same as the first angle. Specifically, the second present angle may be a right angle, that is, the second edge E2 may be perpendicular to the $1^{st}$-$2^{nd}$ edge E1-2. In other words, the edge E1 may be a left edge among the edges of the first indentation portion ID1, and the edge E2 may be a left edge among the edges of the second indentation portion ID2 in FIG. 5.

In this case, the optical camera may be set to recognize only the edge portions of the base film 700 bent at 90°. Accordingly, the optical camera may accurately recognize the edge corners B and C of the base film 700, the corner A formed by the first indentation portion ID1, and the corner D formed by the second indentation portion ID2, and this may be used to align the relative positions between the display panel 10 and the base film 700 in which the adhesive layer 800 is bonded to one surface thereof. Of course, the optical camera may also recognize the outer edge corners of the second portion 720 of the base film 700 (in +x direction). However, the occurrence of errors may be effectively prevented when the optical camera is set to preferentially select the corner A formed by the first indentation portion ID1 and the corner D formed by the second indentation portion ID2, which are located relatively closer to the outer edge corners B and C of the first portion of the base film (in −x direction).

Figure 8:
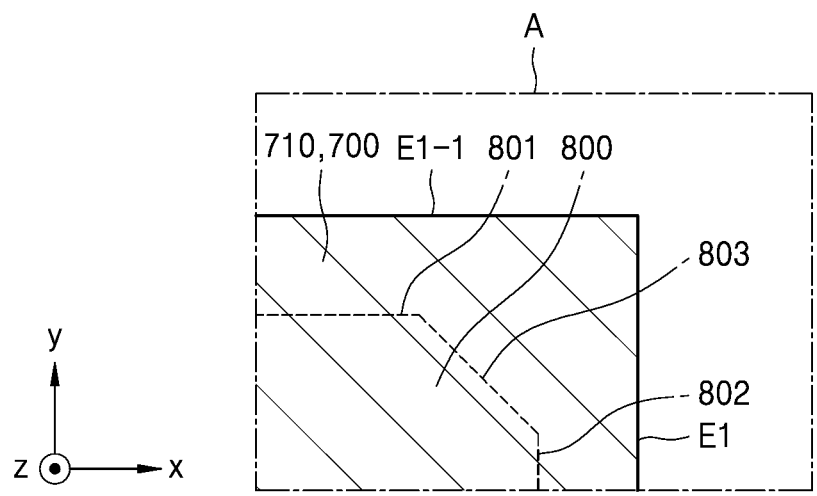
FIG. 8 is an enlarged view of corner A of FIG. 5.

FIG. 8 is an enlarged view of corner A of FIG. 5. It is confirmed from FIG. 8 that, when viewed from a direction (z-axis direction) perpendicular to the base film 700 (i.e., in a plan view), the adhesive layer 800 may have a chamfered shape. Specifically, the adhesive layer 800 may have the chamfered shape formed by edges 801, 802, and 803 at the corner A formed by the $1^{st}$-$1^{st}$ edge E1-1 and the first edge E1 of the base film 700.

As described above, the optical camera used for alignment between the base film 700 and the display panel 10 may be set to sense the right-angled corner of the base film 700. When the adhesive layer 800 does not have a chamfered shape in a plan view and thus has a right-angled corner, the optical camera may sense the right-angled corner of the adhesive layer 800, instead of sensing the right-angled corner of the base film 700. In this case, the base film 700 and the display panel 10 may not be accurately aligned. Of course, as described above, because the light transmittance of the adhesive layer 800 is high, the optical camera may not sense the right-angled corner of the adhesive layer 800, but the optical camera may sense the right-angled corner of the adhesive layer 800 according to a change in surrounding environment, such as illuminance.

In the display module 1 according to the present embodiment, the adhesive layer 800 may have a chamfered shape at the corner A formed by the $1^{st}$-$1^{st}$ edge E1-1 and the first edge E1 of the base film 700. Accordingly, because the optical camera accurately recognizes the corner A formed by the $1^{st}$-$1^{st}$ edge E1-1 and the first edge E1 of the base film 700, the relative position alignment between the base film 700 and the display panel 10 may be accurately achieved. Of course, the adhesive layer 800 may also have a chamfered shape at the corner D formed by the $1^{st}$-$2^{nd}$ edge E1-2 and the second edge E2 of the base film 700.

Figure 9:
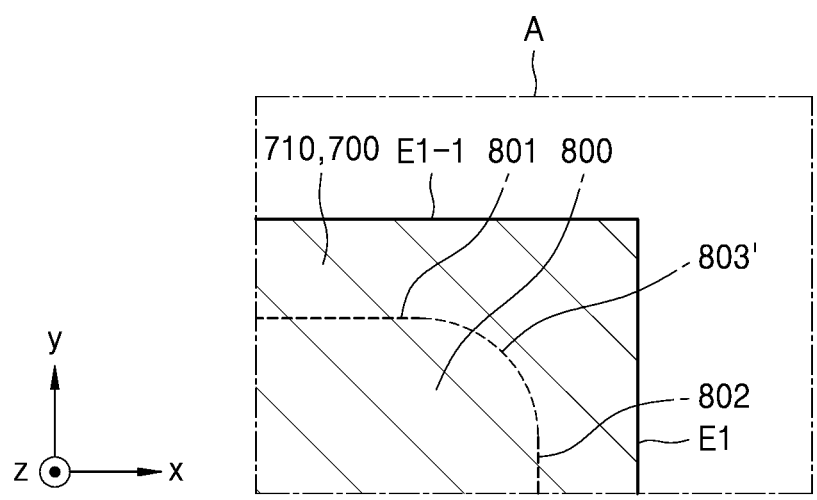
FIG. 9 is a plan view schematically illustrating a portion of a display module, according to an embodiment.

Of course, the adhesive layer 800 may have a round shape instead of a chamfered shape. For example, as illustrated in FIG. 9, which is a plan view schematically illustrating a portion of the display module 1, according to an embodiment, when viewed from a direction (z-axis direction) perpendicular to the base film 700 (i.e., in a plan view), the adhesive layer 800 may have a round shape formed by edges 801, 802 and 803' at the corner A formed by the $1^{st}$-$1^{st}$ edge E1-1 and the first edge E1 of the base film 700. Accordingly, because the optical camera accurately recognizes the corner A formed by the $1^{st}$-$1^{st}$ edge E1-1 and the first edge E1 of the base film 700, the relative position alignment between the base film 700 and the display panel 10 may be accurately achieved. Of course, the adhesive layer 800 may also have a round shape at the corner D formed by the $1^{st}$-$2^{nd}$ edge E1-2 and the second edge E2 of the base film 700.

As illustrated in FIG. 5, in the first indentation portion ID1 between the first portion 710 and the second portion 720 of the base film 700, a third edge E3 of the first indentation portion ID1 in a direction (+x direction) to the second portion 720 and a $2^{nd}$-$1^{st}$ edge E2-1 of the second portion 720 connected to the third edge E3 may form a third preset angle that is different from the first angle. For example, when the first angle is a right angle as described above, the third angle may be an obtuse angle. When the base film 700 has the shape described above, the optical camera may more reliably recognize the right-angled corner A formed by the first indentation portion ID1.

Similarly, in the second indentation portion ID2 between the first portion 710 and the second portion 720 of the base film 700, a fourth edge E4 of the second indentation portion ID2 in a direction (+x direction) to the second portion 720 and a $2^{nd}$-$2^{nd}$ edge E2-2 of the second portion 720 connected to the fourth edge E4 may form a fourth preset angle that is different from the second angle. When the second angle is a right angle as described above, the fourth angle may be an obtuse angle. The fourth angle may be equal to the third angle. When the base film 700 has the shape described above, the optical camera may more reliably recognize the right-angled corner D formed by the second indentation portion ID2. In other words, the edge E3 may be a right edge among the edges of the first indentation portion ID1, and the edge E4 may be a right edge among the edges of the second indentation portion ID2 in FIG. 5.

In the display module 1, in order to prevent infiltration of impurities into the through-hole 100P of the display panel 10 in a manufacturing process in a state where the component 40 is not provided, the base film 700 may be bonded to the display panel 10 by using the adhesive layer 800. Alternatively, after the component 40 is inserted into the through-hole 100P of the display module 1, in order to protect the component 40 or prevent infiltration of impurities into the through-hole 100P of the display panel 10 in a manufacturing process, the base film 700 may be bonded to the display panel 10 by using the adhesive layer 800. In the latter case, when the adhesive layer 800 comes into contact with the component 40, malfunction of the component 40 may be caused in some cases. Further, in the process of bonding the base film 700 to the display panel 10, the pressure applied to the base film 700 may be transferred to the component 40 through the adhesive layer 800, resulting in a damage to the component 40.

Figure 10:
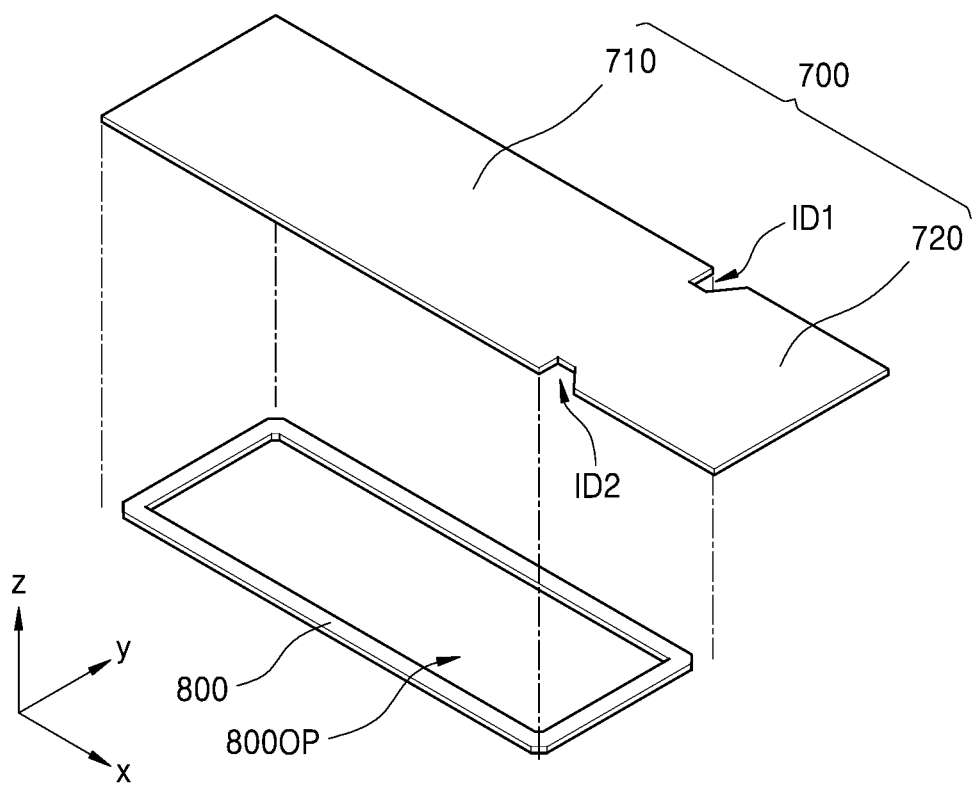
FIG. 10 is an exploded perspective view schematically illustrating a base film and an adhesive layer, which are included in a display module, according to an embodiment.
Figure 11:
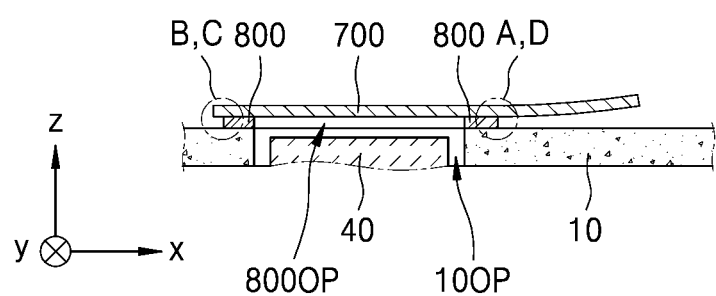
FIG. 11 is a cross-sectional view schematically illustrating a portion of a display module, according to an embodiment.

In order to prevent the above problem from occurring, as illustrated in FIG. 10, which is an exploded perspective view schematically illustrating the base film 700 and the adhesive layer 800, which are included in the display module 1 according to an embodiment, the adhesive layer 800 may define an opening 8000P therein corresponding to the through-hole 100P of the display panel 10. FIG. 11 is a cross-sectional view schematically illustrating a portion of the display module 1 in which the base film 700 is bonded to the display panel 10 by the adhesive layer 800.

In the display module 1 according to the present embodiment, when viewed from a direction (z-axis direction) perpendicular to the base film 700 (i.e., in a plan view), the adhesive layer 800 is located outside the component 40. Therefore, when the base film 700 is bonded to the display panel 10 by using the adhesive layer 800, it is possible to effectively prevent the pressure applied to the base film 700 from being transferred to the component 40 through the adhesive layer 800. As a result, it is possible to effectively prevent the component 40 from being unintentionally damaged in the process of manufacturing the display module 1 or a display device and/or an electronic device including the display module 1.

For reference, when the adhesive layer 800 defines the opening 8000P therein corresponding to the through-hole 100P of the display panel 10, the adhesive layer 800 may have a shape encircling the main surface of the through-hole 100P of the display panel 10.

Figure 12:
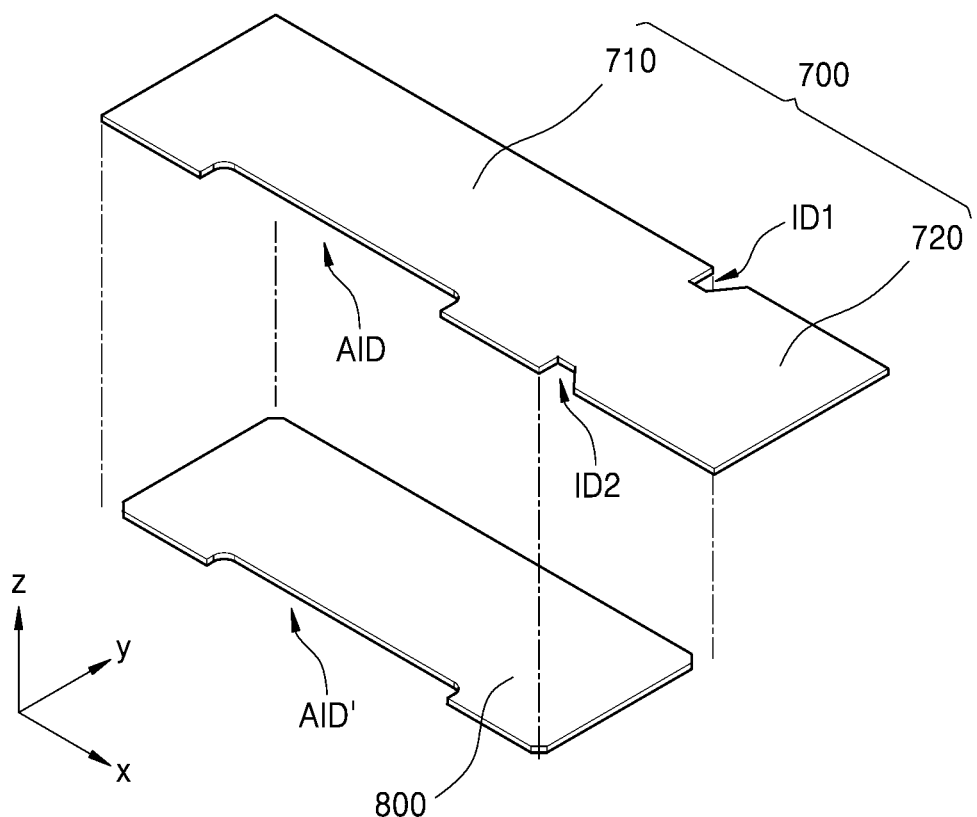
FIG. 12 is an exploded perspective view schematically illustrating a base film and an adhesive layer, which are included in a display module, according to another embodiment.

FIG. 12 is an exploded perspective view schematically illustrating the base film 700 and the adhesive layer 800, which are included in the display module 1, according to another embodiment. As illustrated in FIG. 12, the base film 700 may define an additional indentation portion AID in the first portion 710. Of course, in this case, the adhesive layer 800 may also have an additional indentation portion AID' corresponding to the additional indentation portion AID of the base film 700. When another sensor or the like is located in a portion corresponding to one side of the first portion 710 of the base film 700 of the display panel 10, it is desirable to prevent a pressure from being applied to the sensor or the like in the process of bonding the base film 700 by using the adhesive layer 800. Therefore, when the base film 700 has the additional indentation portion AID at a part of the first portion 710 corresponding to the sensor or the like and the adhesive layer 800 also have the additional indentation portion AID' corresponding to the additional indentation portion AID of the base film 700, it is possible to effectively prevent the sensor or the like from being damaged in the process of bonding the base film 700.

Figure 13:
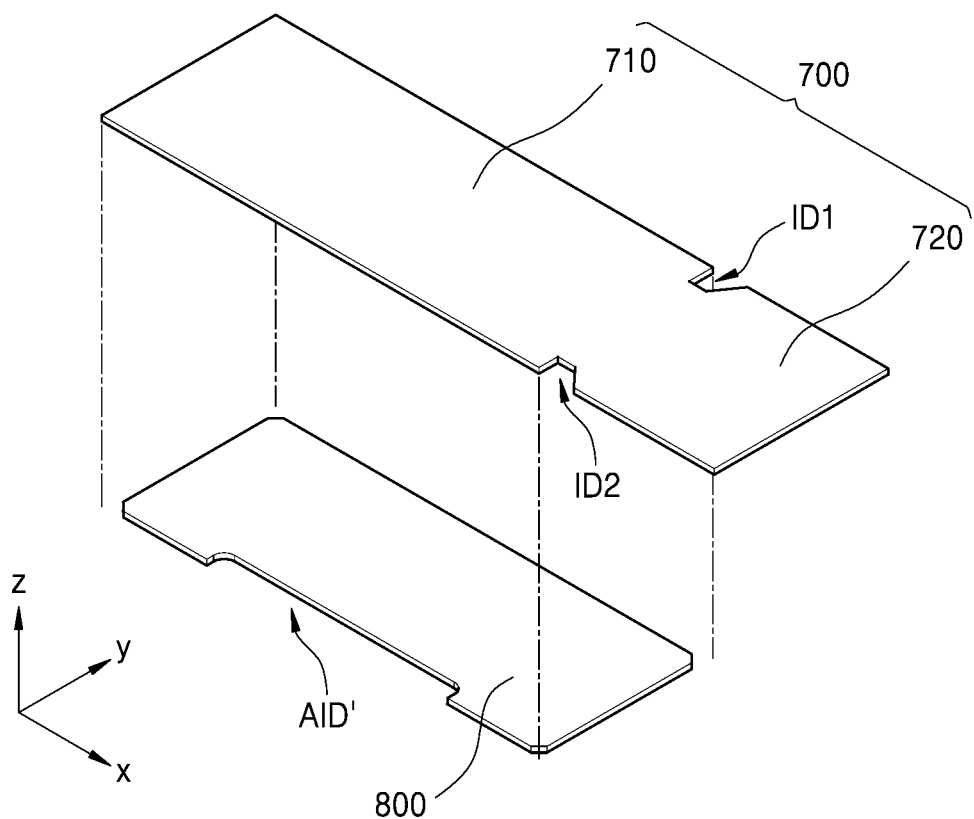
FIG. 13 is an exploded perspective view schematically illustrating a base film and an adhesive layer, which are included in a display module, according to still another embodiment.

The pressure applied to the base film 700 in the process of bonding the base film 700 to the display panel 10 may be transferred to other components through the adhesive layer 800. Therefore, as illustrated in FIG. 13, which is an exploded perspective view schematically illustrating the base film 700 and the adhesive layer 800, which are included in the display module 1 according to still another embodiment, the adhesive layer 800 may define the additional indentation portion AID' even when the base film 700 does not have the additional indentation portion AID at the first portion 710. Accordingly, even when another sensor or the like is located in a portion corresponding to one side of the first portion 710 of the base film 700 of the display panel 10, it is possible to effectively prevent a pressure from being applied to the sensor or the like in the process of bonding the base film 700 by using the adhesive layer 800.

The case where the display panel 10 defines the through-hole 100P therein has been described, but the disclosure is not limited thereto. In another embodiment, for example, even when the display panel 10 defines a groove instead of the through-hole 100P, the description of the base film 700 and the adhesive layer 800 may be equally applied.

According to the embodiments described above, a display module, in which the probability of occurrence of damage in a manufacturing process or the like is reduced, may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display module comprising:
   a display panel comprising a substrate, a transistor layer disposed on the substrate and comprising transistors, and a display layer disposed on the transistor layer and comprising a display element, wherein the display panel defines a groove or a through-hole therein;
   a base film comprising a first portion disposed on the display panel so that a portion of the first portion overlaps the groove or the through-hole, and a second portion connected to the first portion, wherein the base film defines a first indentation portion between the first portion and the second portion; and
   an adhesive layer bonding the first portion to the display panel.

2. The display module of claim 1, further comprising a sensor inserted into the groove or the through-hole.

3. The display module of claim 1, wherein the base film further defines a second indentation portion between the first portion and the second portion, and the second indentation portion faces the first indentation portion.

4. The display module of claim 3, wherein, with respect to an imaginary line extending from a center of the first portion to a center of the second portion, the first indentation portion is located on one side of the imaginary line and the second indentation portion is located on an opposite side of the imaginary line.

5. The display module of claim 4, wherein a first edge of the first indentation portion in a direction to the first portion and a 1 St-1 St edge of the first portion connected to the first edge form a first preset angle.

6. The display module of claim 5, wherein the first preset angle is a right angle.

7. The display module of claim 5, wherein, when viewed from a direction perpendicular to the base film, the adhesive layer has a chamfered shape at a corner formed by the $1^{st}$-$1^{st}$ edge and the first edge.

8. The display module of claim 5, wherein, when viewed from a direction perpendicular to the base film, the adhesive layer has a round shape at a corner formed by the $1^{st}$-$1^{st}$ edge and the first edge.

9. The display module of claim 5, wherein a second edge of the second indentation portion in the direction to the first portion and a $1^{st}$-$2^{nd}$ edge of the first portion connected to the second edge form a second preset angle.

10. The display module of claim 9, wherein the second preset angle is equal to the first preset angle.

11. The display module of claim 9, wherein each of the first preset angle and the second preset angle is a right angle.

12. The display module of claim 9, wherein, when viewed from a direction perpendicular to the base film, the adhesive layer has a chamfered shape at each of a corner formed by the $1^{st}$-$1^{st}$ edge and the first edge and a corner formed by the $1^{st}$-$2^{nd}$ edge and the second edge.

13. The display module of claim 9, wherein, when viewed from a direction perpendicular to the base film, the adhesive layer has a round shape at each of a corner formed by the $1^{st}$-$1^{st}$ edge and the first edge and a corner formed by the $1^{st}$-$2^{nd}$ edge and the second edge.

14. The display module of claim 5, wherein a third edge of the first indentation portion in a direction to the second portion and a $2^{nd}$-$1^{st}$ edge of the second portion connected to the third edge form a third preset angle that is different from the first preset angle.

15. The display module of claim 14, wherein the first preset angle is a right angle and the third preset angle is an obtuse angle.

16. The display module of claim 5, wherein a third edge of the first indentation portion in a direction to the second portion and a $2^{nd}$-$1^{st}$ edge of the second portion connected to the third edge form a third preset angle that is different from the first preset angle, and a fourth edge of the second indentation portion in a direction to the second portion and a $2^{nd}$-$2^{nd}$ edge of the second portion connected to the fourth edge form the third preset angle.

17. The display module of claim 1, wherein the adhesive layer defines an opening therein corresponding to the groove or the through-hole.

18. The display module of claim 1, wherein the adhesive layer encircles the groove or the through-hole when viewed from a direction perpendicular to the base film.

19. The display module of claim 1, wherein the base film further defines an additional indentation portion located in the first portion.

20. The display module of claim 1, wherein the first portion is integral with the second portion.

* * * * *